(12) United States Patent
Chhabra et al.

(10) Patent No.: US 9,058,976 B2
(45) Date of Patent: Jun. 16, 2015

(54) CLEANING COMPOSITION AND PROCESS FOR CLEANING SEMICONDUCTOR DEVICES AND/OR TOOLING DURING MANUFACTURING THEREOF

(71) Applicant: International Business Machines Corporation, Armonk, NY (US)

(72) Inventors: Vishal Chhabra, Fishkill, NY (US); Laertis Economikos, Wappingers Falls, NY (US); John A. Fitzsimmons, Poughkeepsie, NY (US); James Hannah, Ossining, NY (US); Mahmoud Khojasteh, Poughkeepsie, NY (US); Jennifer Muncy, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 226 days.

(21) Appl. No.: 13/669,627

(22) Filed: Nov. 6, 2012

(65) Prior Publication Data
US 2014/0128307 A1 May 8, 2014

(51) Int. Cl.
*H01L 21/02* (2006.01)
*C11D 3/04* (2006.01)
*C11D 3/20* (2006.01)
*C11D 7/08* (2006.01)
*C11D 7/26* (2006.01)
*C11D 11/00* (2006.01)

(52) U.S. Cl.
CPC .......... *H01L 21/02057* (2013.01); *C11D 3/042* (2013.01); *C11D 3/2079* (2013.01); *C11D 3/2086* (2013.01); *C11D 7/08* (2013.01); *C11D 7/265* (2013.01); *C11D 7/267* (2013.01); *C11D 11/0047* (2013.01)

(58) Field of Classification Search
CPC .................................................. C11D 11/0047
USPC .................... 510/175, 176; 134/1.3; 252/79.1
See application file for complete search history.

(56) References Cited

U.S. PATENT DOCUMENTS

| | | | |
|---|---|---|---|
| 4,959,105 A * | 9/1990 | Neidiffer et al. ................... | 134/3 |
| 5,876,508 A | 3/1999 | Wu et al. | |
| 5,981,454 A * | 11/1999 | Small ............................. | 510/175 |
| 6,200,910 B1 | 3/2001 | O'Brien et al. | |
| 6,486,108 B1 * | 11/2002 | Yates et al. ..................... | 510/175 |
| 6,498,131 B1 | 12/2002 | Small et al. | |
| 6,645,051 B2 * | 11/2003 | Sugiyama et al. .............. | 451/41 |
| 6,652,661 B2 | 11/2003 | Martin | |

(Continued)

FOREIGN PATENT DOCUMENTS

| | | |
|---|---|---|
| JP | 7097694 | 4/1995 |
| JP | 11251280 | 9/1999 |
| JP | 2006099847 | 4/2006 |

OTHER PUBLICATIONS

Final Office Action issued in U.S. Appl. No. 13/669,651, dated Jun. 11, 2013; 10 pages.

*Primary Examiner* — Gregory Webb
(74) *Attorney, Agent, or Firm* — Cantor Colburn LLP; Yuanmin Cai

(57) ABSTRACT

Cleaning solutions and processes for cleaning semiconductor devices or semiconductor tooling during manufacture thereof generally include contacting the semiconductor devices or semiconductor tooling with an acidic aqueous cleaning solution free of a fluorine containing compound, the acidic aqueous cleaning solution including at least one antioxidant and at least one non-oxidizing acid.

6 Claims, 2 Drawing Sheets

(56) References Cited

U.S. PATENT DOCUMENTS

| | | | |
|---|---|---|---|
| 6,869,487 B1 | 3/2005 | Bergman | |
| 7,014,552 B1 | 3/2006 | Collier et al. | |
| 7,135,444 B2 * | 11/2006 | Yates et al. | 510/175 |
| 7,235,188 B2 | 6/2007 | Daviot et al. | |
| 7,314,575 B2 | 1/2008 | Marumo et al. | |
| 7,368,064 B2 * | 5/2008 | Aoki et al. | 216/57 |
| 7,384,870 B2 | 6/2008 | Saito et al. | |
| 7,399,365 B2 | 7/2008 | Aoyama et al. | |
| 7,498,295 B2 | 3/2009 | Fisher et al. | |
| 7,572,758 B2 * | 8/2009 | Shimada et al. | 510/175 |
| 7,727,597 B2 | 6/2010 | Wantanabe et al. | |
| 7,842,192 B2 * | 11/2010 | Bian et al. | 252/79.1 |
| 7,919,446 B1 | 4/2011 | Fresco et al. | |
| 8,759,216 B2 * | 6/2014 | Dysard et al. | 438/689 |
| 2004/0121710 A1 | 6/2004 | Boyd et al. | |
| 2005/0199264 A1 | 9/2005 | Andreas et al. | |
| 2005/0236362 A1 * | 10/2005 | Aoki et al. | 216/57 |
| 2005/0236632 A1 | 10/2005 | Aoki et al. | |
| 2006/0042651 A1 | 3/2006 | Verhaverbeke et al. | |
| 2006/0272677 A1 | 12/2006 | Lee et al. | |
| 2007/0006894 A1 * | 1/2007 | Zhang et al. | 134/2 |
| 2007/0184661 A1 * | 8/2007 | Bian et al. | 438/692 |
| 2008/0287041 A1 | 11/2008 | Kordic et al. | |
| 2009/0130849 A1 * | 5/2009 | Lee | 438/693 |
| 2009/0137191 A1 | 5/2009 | Lee | |
| 2009/0239777 A1 | 9/2009 | Angst et al. | |
| 2010/0105595 A1 | 4/2010 | Lee | |
| 2010/0116870 A1 | 5/2010 | Morri et al. | |
| 2010/0261632 A1 * | 10/2010 | Korzenski et al. | 510/175 |
| 2013/0130500 A1 * | 5/2013 | Sato et al. | 438/689 |
| 2014/0238953 A1 * | 8/2014 | Kojima et al. | 216/17 |

* cited by examiner

CLEANING COMPOSITION AND PROCESS FOR CLEANING SEMICONDUCTOR DEVICES AND/OR TOOLING DURING MANUFACTURING THEREOF

BACKGROUND

The present disclosure generally relates to semiconductor device manufacturing and, more particularly, to the cleaning and removal of residues and/or contaminants formed on the semiconductor device during manufacture.

The integrated circuit manufacturing process can generally be divided into front end of line (FEOL) and back end of line (BEOL) processing. The FEOL processes are focused on fabrication of the different devices that make up the integrated circuit, whereas BEOL processes are focused on forming metal interconnects between the different devices of the integrated circuit. In the FEOL processes, shallow trench isolation structures and gate or memory stacks are typically formed. These structures are fragile due to their increasingly small dimensions and the types of materials used to form the structures. BEOL processes may also have fragile structures such as dual damascene etched openings in low k dielectric materials or polysilicon interconnect lines. Often BEOL processing includes one or more chemical mechanical planarization (CMP) process steps, which are inherently very dirty processes.

The number of photoresist cleaning or stripping steps employed in the semiconductor manufacturing process has grown greatly in the last few years. The increasing number of ion implantation steps has contributed greatly to this increase. Current high current or high energy implant operations are the most demanding in that they require a high degree of wafer cleanliness to be obtained while minimizing or eliminating photoresist popping, surface residues, and metal contamination while requiring substantially no substrate/junction loss or oxide loss. Likewise, the semiconductor manufacturing process will typically include one or more CMP processes that typically employ abrasive slurries and rotating pads/brushes to effect surface planarization. Defect minimization during semiconductor manufacture is of great interest to the overall success as devices are scaled to smaller dimensions. For example, ceria nanoparticles are often used as the CMP slurry for next generation technology nodes because defect levels are at or below the more traditional silica-abrasive slurries and also because very low concentrations can effectively be used, which translates to lower levels of contamination. However, the semiconductor devices as well as the CMP pads/brushes are often contaminated with particles of ceria that require removal for successful and efficient device manufacture.

Because of the extraordinarily high levels of cleanliness that are generally required during the fabrication of semiconductor substrates, multiple cleaning steps are typically required to remove impurities from the surfaces of the substrates before subsequent processing. A typical surface preparation procedure may include etch, clean, rinse and dry steps. During a typical cleaning step, the substrates may be exposed to a cleaning solution that can include mixtures of hydrogen peroxide and ammonium hydroxide, and/or hydrochloric acid, and/or sulfuric acid, and/or hydrofluoric acid with a surfactant. These solutions are commonly referred by those in the art to as SC1, SC2, HPM, APM and IMEC cleaning solutions. After cleaning, the substrates are rinsed using ultra-pure water and then dried using one of several known drying processes. In some instances, the cleaning solutions may be in combination with acoustical cleaning methods, e.g., ultrasonics, megasonics, and the like.

In various advanced development processes required for semiconductor device manufacture, either rare earth metals or transition metals are required to be selectively removed in the presence of very similar metallurgy. In addition, reactive ions etch (RIE) or CMP processes may leave modified residues related to these rare earth or transition metallurgy. In FEOL processes, the typical cleaning chemistries are not selective enough to differentiate between some of these residues that must be removed or metals and the metals required to remain. For example, SC1 is commonly used to remove FEOL residue, but is also known to attack TiN surfaces. TiN is used as a component of some metal gate structures and any loss of TiN in these metal gate structures can result in an undesirable decrease or change in device performance.

Accordingly, it would be desirable to have a process and chemistry that is capable of removing undesired residue without producing a undesired decrease or change in device performance.

BRIEF SUMMARY

Disclosed herein are compositions and processes for cleaning semiconductor devices and/or semiconductor tooling. In one embodiment, an aqueous cleaning solution for cleaning semiconductor devices and/or semiconductor tooling, the aqueous cleaning solution comprises at least one antioxidant; at least one non-oxidizing acid; and water, wherein the aqueous cleaning solution is acidic and is free of a fluorine containing compound.

In another embodiment, a process for cleaning a semiconductor device or tooling during manufacture thereof, the process comprises contacting the semiconductor device or tooling with an acidic aqueous solution that is free of a fluorine containing compound for a period of time and at a temperature effective to remove residues from the semiconductor device or tooling, wherein the acidic aqueous solution comprises at least one antioxidant and at least one non-oxidizing acid.

The disclosure may be understood more readily by reference to the following detailed description of the various features of the disclosure and the examples included therein.

BRIEF DESCRIPTION OF THE SEVERAL VIEWS OF THE DRAWINGS

Referring now to the figures wherein the like elements are numbered alike.

DETAILED DESCRIPTION

Figure 1:
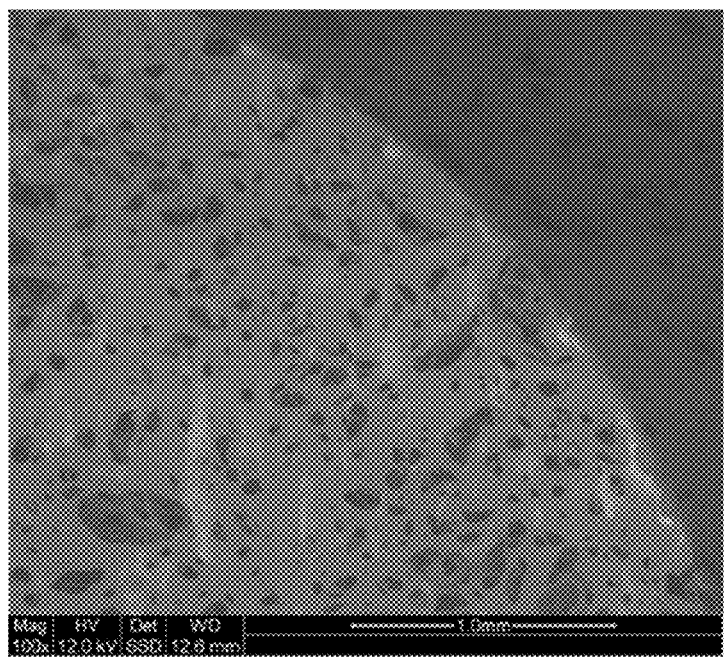
FIG. 1 is a scanning electron micrograph of a ceria contaminated polishing pad.

Disclosed herein are aqueous cleaning processes and compositions for cleaning substrates during semiconductor manufacturing. The processes generally include exposing the substrate to an acidic aqueous cleaning solution free of a fluorine containing compound having a composition that generally including an antioxidant, a non-oxidizing acid, and water. Surprisingly and advantageously, the process and composition provide effective removal of particles and residues without the need for a fluorine containing compound while not damaging underlying material in contact therewith during processing such as, but not limited to, Si, $SiO_2$, TEOS, $Si_3N_4$, TiN, TaN, TaAlN, TiAlN, and the like. Likewise, the aqueous cleaning process and composition can be utilized to effectively clean the semiconductor tooling associated with semiconductor manufacture. For example, the aqueous cleaning process and composition can be used to remove rare earth lanthanides such as ceria particles that may be entrained in the brushes and/or pads used in chemical mechanical processing to effect surface planarization.

As used herein, the terms residues and particles generally refer to post ash, post etch, and post CMP materials and may byproducts thereof that may be formed on the device and tooling surfaces. For example, post CMP residue generally refers to particles from the polishing slurry, e.g., ceria containing particles, silica containing particles, and the like; chemicals present in the slurry; reaction byproducts of the polishing slurry; carbon rich particles; polishing pad particles; brush deloading particles; tooling materials of construction particles; copper; copper oxides; copper containing materials; aluminum; aluminum oxides; aluminum containing materials; organic residues; and any other materials that are byproducts of the CMP process.

While not wanting to be bound by theory, it is believed the antioxidant in the acidic aqueous cleaning composition provides antioxidant properties, i.e., inhibits oxidation, and also a ligand effect to provide significant and unexpected cleaning action. Suitable antioxidants are soluble in water at an acidic pH. Exemplary antioxidants include ascorbic acid, citric acid, lactic acid, erythorbic acid, derivatives, and mixtures thereof. In one embodiment, the antioxidant is in the aqueous cleaning solution in an amount within a range of 0.5% to 10% weight by weight (w/w), and in other embodiments, within a range of 1 to 5 (% w/w), and in still other embodiments, within a range of 1 to 3% (w/w).

As generally defined herein, the term "non-oxidizing acid" generally refers to an acid that cannot act as an oxidizing agent. Suitable non-oxidizing acids include both inorganic and organic acids. Exemplary non-oxidizing inorganic acids include, without limitation, sulfuric acid, hydrochloric acid, hydroiodic acid, hydrobromic acid, hydrofluoric acid, phosphoric acid, mixtures thereof and the like. Exemplary non-oxidizing organic acids include, without limitation, methane sulfonic acid, acetic acid, formic acid, butyric acid, propionic acid, mixtures thereof and the like. In one embodiment, the non-oxidizing acid is in the aqueous cleaning solution in an amount within a range of 0.1 to 10% weight by weight (w/w), and in other embodiments, within a range of 1 to 8% (w/w), and in still other embodiments, within a range of 2 to 5% (w/w).

The cleaning solution is an aqueous solution, wherein the water component can be deionized water. The aqueous cleaning solution can be free of any other solvents. Additionally, the aqueous cleaning solution can be free of a fluorine containing compound and provide effective cleaning while not damaging underlying material in contact therewith during processing.

The aqueous cleaning solution is acidic and has a pH less than 7; in other embodiments, the aqueous cleaning solution has a pH less than 5 and in still other embodiments, aqueous cleaning solution has a pH less than 2, and in yet other embodiments, aqueous cleaning solution has a pH of less than 1. An acidic pH is generally preferred because the residue can be thoroughly removed without damaging the underlying structure and solubility of the antioxidant and/or the antioxidant residue complex is generally enhanced. The pH may be measured by using a known pH meter or other techniques generally suitable to measure pH within the suggested pH range that do not have interference in measurement of an acidic reducing solution.

In an exemplary embodiment, the cleaning solution includes an acidic aqueous solution of ascorbic acid and sulfuric acid.

Optionally, the aqueous cleaning solutions may further contain a surfactant, a chelating agent, a pH buffer, and the like.

Exemplary surfactants that may be used include a nonionic surfactant, an anionic surfactant, a cationic surfactant, an ampholytic surfactant, and combinations thereof. The surfactant improves residue removal by effectively minimizing agglomeration and re-deposition of particles/residues from substrates, tooling surfaces, and solutions.

Examples of the nonionic surfactant that may be used include polyalkylene oxide alkyl phenyl ether surfactants, polyalkylene oxide alkyl ether surfactants, polyethylene oxide-polypropylene oxide block copolymer surfactants, polyoxyalkylene distyrenated phenyl ether surfactants, polyalkylene tribenzyl phenyl ether surfactants and acetylene polyalkylene oxide surfactants. Exemplary polyalkylene oxide (hereinafter abbreviated as "PAO") alkyl ether surfactant include, without limitation, PAO decyl ether, PAO lauryl ether, PAO tridecyl ether, PAO alkylene decyl ether, PAO sorbitan monolaurate, PAO sorbitan monooleate, PAO sorbitan monostearate, polyethylene oxide sorbitol tetraoleate, PAO alkylamine, and PAO acetylene glycol, mixtures thereof, and the like.

A cationic surfactant can also be used in the present disclosure and has been found to provide an increase in the removability of the residues and the resistance to corrosion of the substrate and the dielectric film. Preferred examples of the cationic surfactant include a quaternary ammonium salt surfactant.

An example of a suitable quaternary ammonium salt surfactant includes a compound represented by general formula (I)

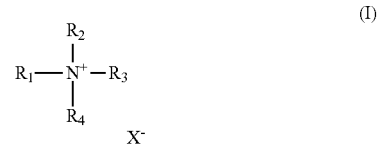

wherein $X^-$ represents a hydroxide ion, a chlorine ion, a bromine ion sulfate ion or a nitrate ion; $R_1$ to $R_4$ independently represents an alkyl group and/or an aralkyl group having 1 to 24 carbon atoms.

Non-limiting examples of the compound represented by general formula (I) include ammonium octyl sulfate, ammonium lauryl sulfate, and the like. The counter anion of these illustrated compounds is not limited to sulfate ion but may be chloride ion, bromine ion, hydroxide ion, or nitrate ion.

Additionally, anionic surfactant agents have been found to have utility especially in low pH formulations. We have observed that water soluble perfluorocarboxylic acids or sulfate esters such as heptafluorobutyric acid, or heptafluorobutyric acid sulfate can act as surfactant/dispersant agents at pH values below pH 2. While there are known industry restrictions on perfluorooctanoic acid sulfates (PFOAS), perfluorooctanoic acids (PFOA), there remain some lower molecular weight compounds in this family of chemistries that have not demonstrated the undesired behavior of PFOAS and still retain the desired behaviors: heptafluorobutyric acid is an example of this type of compound and included as an example of such a potential candidate. Any anionic surfactant used in the present formulations preferably is within EPA guidelines and functions as a surfactant/dispersant within the formulation pH range.

The surfactant is incorporated in the aqueous cleaning solution in an amount of preferably 0.0001 to 5 wt % and more preferably 0.0001 to 1 wt % with respect to the total weight of the aqueous cleaning solution. The addition of the surfactant to the aqueous cleaning solution enables viscosity to be adjusted to improve the wettability of the liquid with respect to the object to be cleaned. In general, such surfactants are commercially available. These surfactants may be used singly or in combination of two or more. Advantageously, residue removal is generally improved form some applications relative cleaning solutions without the surfactant(s).

As noted above, the aqueous cleaning solution may further include a chelating agent, which can enhance removal of metal ions, for example. Examples of a suitable chelating agent include a group of aminopolycarboxylic acid salts such as, but not limited to, ethylenediaminetetraacetate (EDTA), diethylenetriaminepentaacetate (DTPA), 1,2-cyclohexyleneaminotetraacetic acid (CDTA), hydroxyethylethylenediaminetriacetate (HEDTA), dihydroxyethylethylenediaminetetraacetate (DHEDDA), nitrilo triacetate (NTA), hydroxyethyliminodiacetate (HIDA), β-alanine diacetate, aspartic acid diacetate, methylglycine diacetate, iminodisuccinate, serine diacetate, hydroxyiminodisuccinate, dihydroxyethylglycine salt, aspartate, glutamate, and the like; a group of hydroxycarboxylic acid salts such as, but not limited to, hydroxyacetate, tartrate, citrate, gluconate, and the like; a group of cyclocarboxylic acid salts such as, but not limited to, pyromellitate, benzopolycarboxylate, cyclopentane tetracarboxylate, and the like; a group of ether carboxylic acid salts such as, but not limited to, carboxymethyl tartronate, carboxymethyloxy succinate, oxydisuccinate, tartaric acid monosuccinate, tartaric acid disuccinate, and the like; a group of other carboxylic acid salts such as, but not limited to, maleic acid derivative, oxalate, and the like; a group of organic carboxylic acid (salt) polymers such as, but not limited to, acrylic polymers and copolymers (such as acrylic acid-allyl alcohol copolymer, acrylic acid-maleic acid copolymer, hydroxyacrylic acid polymer, polysaccharide-acrylic acid copolymer, and the like; a group of polyvalent carboxylic acid polymers and copolymers such as, but not limited to, polymers and copolymers of monomers such as maleic acid, itaconic acid, fumaric acid, tetramethylene-1,2-dicarboxylic acid, succinic acid, aspartic acid and glutamic acid, and the like; glyoxylic acid polymers; a group of polysaccharides such as, but not limited to, starch, cellulose, amylose, pectin, carboxymethyl cellulose, and the like; a group of phosphonic acid salts such as, but not limited to, methyl diphosphonic acid salt, aminotrismethylene phosphonic acid salt, ethylidene diphosphonic acid salt, 1-hydroxyethylidene-1,1-diphosphonic acid salt, ethylaminobismethylene phosphonic acid salt, ethylenediaminebismethylene phosphonic acid salt, ethylenediaminetetramethylene phosphonic acid salt, hexamethylenediaminetetramethylene phosphonic acid, propylenediaminetetramethylene phosphonic acid salt, diethylenetriaminepentamethylene phosphonic acid salt, triethylenetetraminehexamethylene phosphonic acid salt, tetraethylenepentamineheptamethylene phosphonic acid salt, and the like; dimercaporal (BAL); various combinations thereof; and the like.

Exemplary salts of these compounds include ammonium salts and salts of alkanolamines (such as monoethanolamine and triethanolamine). These may be used singly or in combination of two or more.

The chelating agent is preferably used in the aqueous cleaning solution at a concentration of 0 to 10 wt % with respect to the total weight of the aqueous cleaning solution.

Exemplary optional pH buffering agents include, but are not limited to, hydroxides, quaternary ammonium hydroxides, glycines, hydrogen phthalates, acetates, oxalates, carbonates, carbamates, citrates, methyl diethanolamine (MDEA), salicylic acid, boric acid, sulfosalicylic acid, ethane-1-hydroxy-1,1-diphosphoinic acid (HEDP), sulfamic acid, sulfonic acids, choline hydroxide, monoethanolamine, acetylacetone, and combinations thereof. When the pH is within a range of about 2 to 7, the pH buffer is typically in an amount effective to maintain the pH at a range of −1.0 to 0.9 relative to the target pH. At pHs lower than 2, effective buffering agents are relatively limited. We note that water soluble perfluoro carboxcylic acids such as heptafluorobutyric acid by virtue of their pKa values may act as effective buffering agents within these lower pH ranges and as dictated by the Henderson-Hasselbalch equation may be used to construct a buffering agent within this pH region. Again the use of Perfluoro alkane chemicals may be restricted by EPA findings and these recommendations are respected and followed. However, as previously discussed, there remain some lower molecular weight compounds in this family of chemistries that have not demonstrated the undesired behavior of PFOA or PFOAS; and as such, acids with pKa values of 2 or less may employed to enhance buffering behavior below pH 2.

The process for cleaning the semiconductor device and/or tooling during manufacture generally includes containing the aqueous cleaning solution with the semiconductor device and/or tooling to be cleaned. The type of contact is not intended to be limited and may include immersion, dipping, spraying, spin coating, combinations thereof, and the like. The cleaning step may be repeated as may be desired for different applications. The temperature of the aqueous cleaning solution can be within a range from about 10° C. to about 100° C. in most embodiments, with a temperature within a range of 15° C. to 80° C. in other embodiments, and a temperature of 20 to 50° C. in still other embodiments.

The period of time for which the cleaning solution contacts the semiconductor device will generally depend on the preceding manufacturing step. Typically, the period of time will range from about 10 seconds to about 60 minutes in most embodiments, with a period of time within a range of about 10 seconds to about 30 minutes in other embodiments, and with a period of time within a range of about 1 minute to about 15 minutes in still other embodiments.

The present process can be used in individually or in combination with one or more other cleaning processes such as the SC1 and/or SC2 cleaning processes. If such a combination is used, the order of performance is not intended to be limited to any particular order. Likewise, where appropriate, the present process can be used in combination with acoustical and/or mechanical energy.

By way of example, the aqueous cleaning solution and process can be used to clean the polishing pads/brushes used during chemical mechanical planarization (CMP). A CMP system typically includes components for handling and polishing the semiconductor substrates. Such components can include an orbital pad. In operation, the pad is put in motion and then a slurry material is applied and spread over the surface of the pad. Slurries typically used for CMP can include rare earth elements in the lanthanide series such as ceria in the form of nanoparticles to effect planarization. Once the pad is rotating at the desired speed, the semiconductor substrate is placed in contact with the pad. The substrate is then sent to be cleaned in a substrate cleaning system. It is important to clean the substrate after CMP because particles, particulates and residues can remain on the substrate. These residues can cause damage to the semiconductor substrate during subsequent processing.

Better cleaning in the substrate cleaning system can be achieved by improving the processes used in the CMP. In this regard, pad conditioning is often performed to remove excess slurry and residue build-up. Advantageously, it has been found that the acidic aqueous cleaning solution including an antioxidant such as ascorbic acid and a non-oxidizing acid such as sulfuric acid effectively removed ceria deposits from the pad.

The following examples are presented for illustrative purposes only, and are not intended to limit the scope of the invention.

Example 1

In this example, a comparison was made between prior art cleaning chemistries and a cleaning process with an aqueous cleaning solution in accordance with the present disclosure. A cleaning solution in accordance with the present disclosure, referred to herein as dAS, was compounded in aqueous solution and included 1% (w/w) ascorbic acid in 2% (w/w) sulfuric acid as active agents. The dAS solution was used to clean a substrate including a TiN surface having a defined thickness at room temperature (25° C.) for two different immersion times: 60 seconds and 300 seconds. Following immersions, the substrates were rinsed with deionized water and dried. Thickness of the TiN layer was measured before and after cleaning. The results are shown in Table 1 below.

TABLE 1 dAS Cleaning Process

| Sample | Pre-Thickness of TiN (Å) | Immersion Time (seconds) | Post Thickness of TiN (Å) | Thickness Difference (Å) | Etch Rate (Å/minute) |
|---|---|---|---|---|---|
| A | 94.88 | 60 | 94.50 | 0.38 | 0.08 |
| B | 57.92 | 300 | 57.63 | 0.29 | 0.29 |

The results indicate that neither dAS exposure removed TiN material within the noise limit of the measurement. The noise limit of the measurement is less than 1 angstrom.

A prior art cleaning processes were compared to our dAS process with respect to TiN etch using an industry standard cleaning process referred to as SC1, in a process chemistry design space generally selected to minimize TiN etch. The composition included a solution of $NH_4OH$ (ammonium hydroxide), $H_2O_2$ (hydrogen peroxide), $H_2O$ (water), at a ratio of 1:1.5:50 respectively at 25° C. for various immersion times The results are reported in table 2 below.

TABLE 2

SC1 Prior art Cleaning Process

| Sample | Immersion Time (Seconds) | Thickness Difference (Å) | Etch Rate (Å/minute) |
|---|---|---|---|
| C* | 300 | 14.80 | 2.96 |
| D* | 600 | 29.60 | 2.96 |
| E* | 900 | 37.40 | 2.49 |
| F* | 1200 | 65.40 | 3/27 |

*comparative examples

The results indicate an average etch rate of 2 to 3 angstroms per minute with a loss of about 10-15 Angstroms for a 600 second immersion. It is important to note that while more concentrated solutions of SC1 may improve cleaning, the additional aggressiveness against TiN is detrimental and contraindicated for the purposes of non-destructive cleaning. More concentrated solutions of SC1 are known to etch titanium nitride with more aggressive etching rates such as is disclosed in U.S. Pat. No. 6,200,910. Thus, if more aggressive SC1 solutions are used to improve cleaning performance, additional TiN material loss will likely result. As demonstrated above, the dAS cleaning solution that can clean surfaces without the negative aspects of TiN attack.

Example 2

In this example, we have studied the use of hot sulfuric acid as a pre-step to remove organic contamination prior to dAS cleaning. This sequence of hot sulfuric followed by dAS was also evaluated with respect to TiN loss. The process included immersing a substrate including TiN to sulfuric acid at 55° C. for 600 seconds followed by immersion to dAS at 25° C. with a subsequent deionized water rinse and drying process. The results are shown in Table 3 below.

TABLE 3

Hot Sulfuric Acid/dAS Cleaning Sequence

| Sample | Hot sulfuric acid exposure (seconds) | dAS exposure (seconds) | Total TiN Removal (Å) | Hot sulfuric acid TiN Removal (Å) | dAS TiN Removal (Å) |
|---|---|---|---|---|---|
| G | 600 | 300 | 10.65 | 10.57 | 0.08 |

As demonstrated above, the exposure of the hot sulfuric acid dominates and/or dictates the TiN removal in this process sequence. The measured TiN loss from only the hot sulfuric acid step is about 10.57 Angstroms and is similar to that observed from the soft SC1 in Example 1 that had a loss of about 10 to 15 angstroms. Thus, a combined hot sulfuric acid/dAS cleaning sequence can be employed for more aggressive cleaning than a single SC1 step with a similar TiN loss. If the hot sulfuric acid/dAS cleaning sequence was replaced by an analogous hot sulfuric acid (10 minutes, 55° C.) soft SC1 (5 minutes) sequence, the combination of these processes would be expected to double the amount of TiN loss. In view of the foregoing, the combination of the hot sulfuric acid or the soft SC1 may be employed with the dAS for conditions requiring more aggressive cleaning and yet provide minimal TiN losses compared to combinations of prior art cleaning processes, e.g., hot sulfuric acid/soft SC1.

The cleaning solution provided effective removal of undesired residue whereas the typical industrial alternatives were unable to produce a similar reduction in particles from the surface.

Example 3

In this example, the cleaning solution was used to remove ceria from CMP contaminated pads. The pads were exposed to an aqueous solution of dAS as in example 1 for a period of 600 seconds followed by a 30 second deionized rinsing step.

Figure 2:
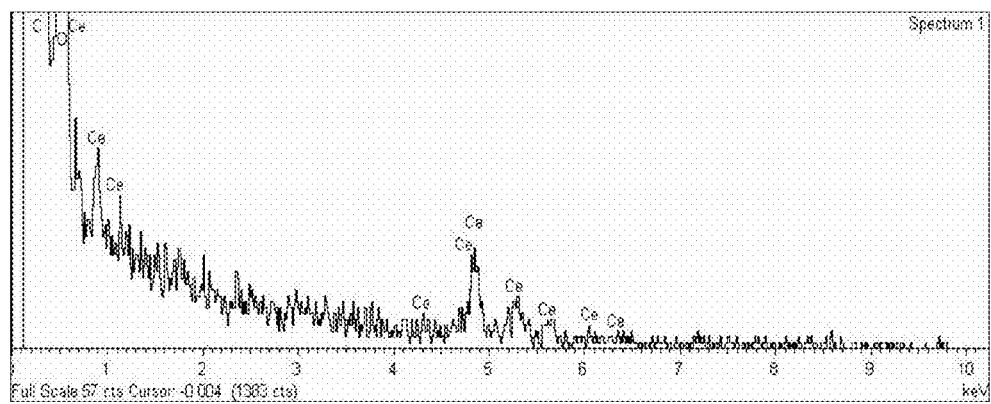
FIG. 2 graphically illustrates electron dispersive spectroscopy data for the ceria contaminated pad of FIG. 1.
Figure 3:
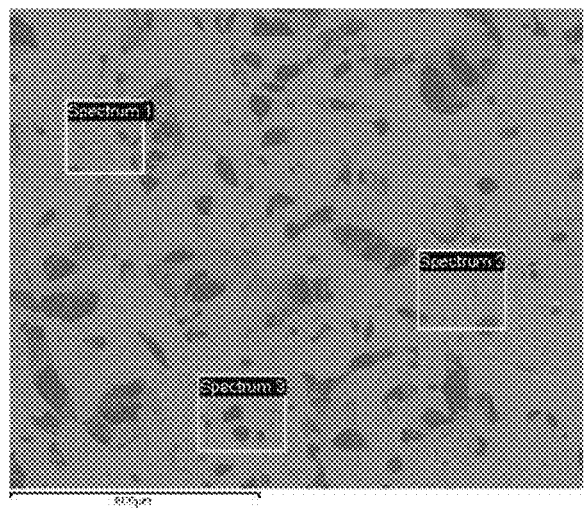
FIG. 3 is a scanning electron micrograph of the contaminated polishing pad after cleaning with a dAS aqueous cleaning solution in accordance with the present disclosure.
Figure 4:
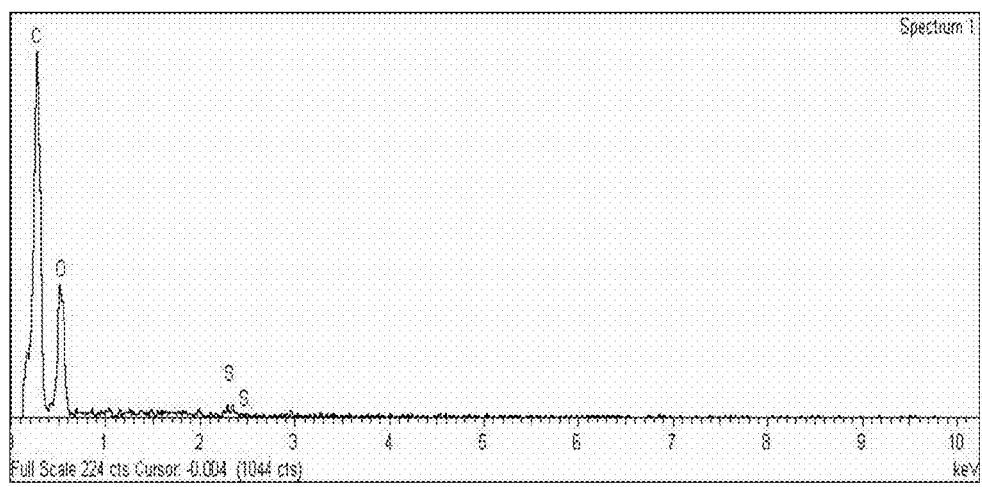
FIG. 4 graphically illustrates electron dispersive spectroscopy data for the cleaned pad of FIG. 3.

FIGS. 1 and 2 provide scanning electron microscopy-energy dispersive spectroscopic (SEM-EDS) data, respectively, of the contaminated pad. As shown, significant deposits of ceria and ceria derivatives on the pad are clearly evident. FIGS. 3 and 4 provide SEM-EDS data, respectively, after cleaning the pad with the aqueous cleaning solution. As clearly demonstrated, no ceria signature is evident indicating that the aqueous cleaning solution was highly effective for removing ceria and ceria derivatives from the contaminated pads.

Example 4

In this example, solubility of a ceria containing precipitate was measured as a function of concentration of the ascorbic acid/sulfuric acid within the cleaning solution. Grams of the ceria containing precipitate were added to the same volume of solution. It was found that solubility (and cleaning efficiency) was effectively increased by increasing the concentration of the aqueous cleaning solution from 1% (w/w) ascorbic acid in 2% (w/w) sulfuric acid to 5% (w/w) ascorbic acid in 5% (w/w) sulfuric acid. Thus, the cleaning solution can be tailored to the residues being removed from the substrate.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An aqueous cleaning solution for cleaning semiconductor devices and/or semiconductor tooling, the aqueous cleaning solution comprising:
   ascorbic acid;
   sulfuric acid; and
   water, wherein the aqueous cleaning solution is acidic and is free of a fluorine containing compound, and wherein the ascorbic acid is in an amount from 1 to 5% (w/w) and the sulfuric acid is an amount greater than 2% (w/w) to 5% (w/w).

2. The aqueous cleaning solution of claim 1, wherein the aqueous cleaning solution has a pH of less than 5.

3. The aqueous cleaning solution of claim 1, wherein the aqueous cleaning solution has a pH of less than 2.

4. The aqueous cleaning solution of claim 1, further comprising a surfactant, a pH buffer, a chelating agent, or mixtures thereof.

5. The aqueous cleaning solution of claim 4, wherein the surfactant comprises a quaternary ammonium salt surfactant.

6. The aqueous cleaning solution of claim 4, wherein the surfactant comprises ammonium octyl sulfate, ammonium lauryl sulfate, or mixtures thereof.

* * * * *